United States Patent
Yang

(10) Patent No.: US 7,663,062 B1
(45) Date of Patent: Feb. 16, 2010

(54) FLEXIBLE CIRCUIT BOARD

(75) Inventor: Kai-Chi Yang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 64 days.

(21) Appl. No.: 12/182,294

(22) Filed: Jul. 30, 2008

(51) Int. Cl.
*H05K 1/00* (2006.01)

(52) U.S. Cl. ............... 174/254; 174/68.1; 174/117 F; 174/117 FF; 174/268

(58) Field of Classification Search ............ 174/68.1, 174/250, 251, 254, 261, 268, 72 TR, 73.1, 174/75 R, 117 F, 117 FF, 32; 361/748, 749, 361/792

See application file for complete search history.

(56) References Cited

U.S. PATENT DOCUMENTS

| | | | | |
|---|---|---|---|---|
| 4,992,059 A | * | 2/1991 | King et al. | ............... 439/492 |
| 7,240,416 B2 | * | 7/2007 | Milojevic et al. | ........... 29/592.1 |
| 2003/0127245 A1 | * | 7/2003 | Kusaka | .................... 174/250 |
| 2007/0018307 A1 | * | 1/2007 | Shinomiya | .............. 257/691 |
| 2008/0202797 A1 | * | 8/2008 | Kubo | ..................... 174/254 |

FOREIGN PATENT DOCUMENTS

JP     11-345839     12/1999

* cited by examiner

*Primary Examiner*—Jinhee J Lee
*Assistant Examiner*—Hoa C Nguyen
(74) *Attorney, Agent, or Firm*—J.C. Patents

(57) ABSTRACT

A flexible circuit board uses a specific structure to alleviate mechanical stress thereof. The flexible circuit board has a flexible film, a plurality of inner leads, a plurality of outer leads, and a plurality of connection portion. Each of the connection portions a corresponding one of the inner leads with a corresponding one of the outer leads. A first width of the inner leads is greater than a second width of the outer leads. Due to rounded concave sections and rounded convex sections of the connection portions, if the flexible circuit board is bent, the mechanical stress around corners of joint portions of the connection portions with the inner leads and the outer leads could be alleviated.

8 Claims, 15 Drawing Sheets

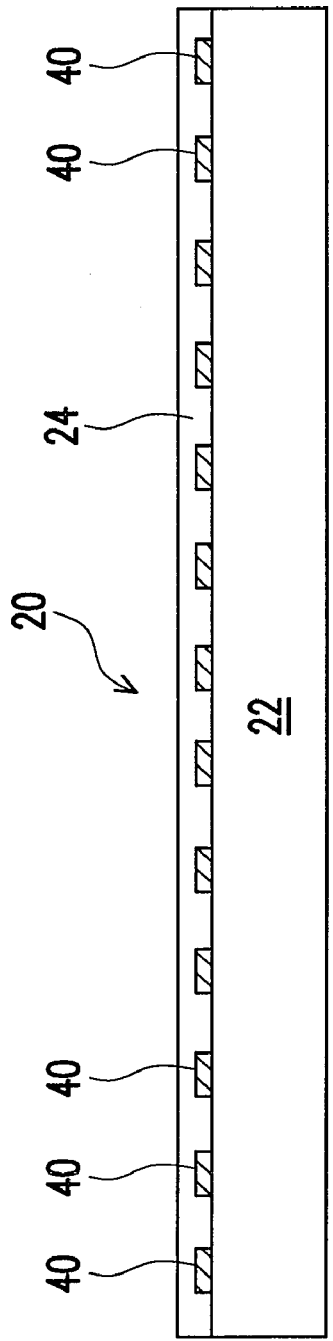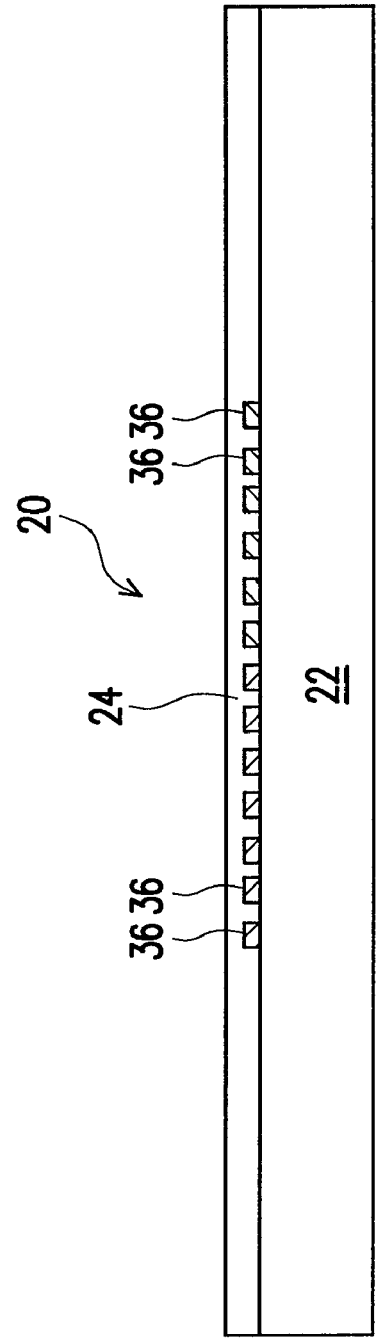

FLEXIBLE CIRCUIT BOARD

BACKGROUND OF THE INVENTION

1. Field of Invention

The present invention is related to flexible circuit board, and more specifically, to a flexible circuit board having a specific structure to alleviate mechanical stress thereof.

2. Description of Related Art

With the development of packaging technology, chip on film (COF) bonding technology has become one of the progressive packaging technologies. Generally, COF bonding technology can be applied broadly, for example, the electrical connection between a liquid crystal panel and a driver IC is one of the applications using COF bonding technology.

Referring to FIGS. 1 and 2. FIG. 1 is a cross-sectional diagram of an electronic apparatus 4, and FIG. 2 is a cross-sectional diagram of another electronic apparatus 6. Each of the electronic apparatuses 4 and 6 could be, for example, a thin film transistor liquid crystal display (TFT-LCD), a plasma display, an organic light-emitting diode display (OLED), etc. Each of the electronic apparatuses 4 and 6 has a display panel 8, a printed circuit board (PCB) 10, a driver IC 12, and a flexible circuit board 14. The PCB 10 has an embedded timing controller for generating a timing signal to control the operations of the driver IC 12. The flexible circuit board 14 could be bent such that the PCB 10 could be positioned on the top of the electronic apparatus 4 (as shown in FIG. 1) or positioned behind the display panel 8 (as shown in FIG. 2). The driver IC 12 is formed on the flexible circuit board 14 and operates according to the timing signal received from the timing controller embedded in the PCB 10.

Referring to FIG. 3, which is a schematic diagram of the display panel 8, the PCB 10, the driver IC 12, and the flexible circuit board 14. The driver IC 12 formed on the flexible circuit board 14 is electrically connected to the PCB 10 via a plurality of wires 16 and to the display panel 8 via a plurality of wires 18. Each of the wire 16 has an outer lead 1a, an inner lead 1b, and a connection portion 1c that connects to the outer lead 1a with the inner lead 1b. As shown in FIG. 3, the width of the outer leads 1a is greater than the width of the inner leads 1b, and the wires 16 are warped and have sharp corners. However, since the flexible circuit board 14 is bent, the joint portion of the outer lead 1a and the connection portion 1c and the joint portion of the inner lead 1b and the connection portion 1c are easily to be broken due to their high stress concentrations resulted from the sharp corners, such that the signal transmission between the PCB 10 and the driver IC 12 would be failed.

In a Japan published patent application NO. H11/345839, a flexible circuit board is disclosed. Referring to FIGS. 4 and 5. FIG. 4 is a schematic diagram of the flexible circuit board disclosed in the Japan published patent application, and FIG. 5 is an enlarged diagram of a wire of the flexible circuit board shown in FIG. 4. As shown in FIG. 4, two wires of the flexible circuit board are respectively formed with a corresponding indentation 2. Each of the indentations 2 is a rounded concave section of the interior side, which could alleviate the mechanical stress of an inner side 2a of the joint portion of the outer lead 1a and the connection portion 1c. However, the joint portion 2b of the inner lead 1b and the connection portion 1c is a sharp corner, thereby still suffering a high stress concentration that increases the possibility that the joint portion 2b may break under force.

SUMMARY OF THE INVENTION

The present invention provides a flexible circuit board to decrease the possibility that the joint portions of the outer leads and the connection portions break under force.

The present invention provides a flexible circuit board to decrease the possibility that the joint portions of the inner leads and the connection portions break under force.

Accordingly, an object of the present invention is to provide a flexible circuit board. The flexible circuit board comprises a flexible film, a plurality of inner leads, a plurality of outer leads, and a plurality of connection portions. The inner leads are formed on the flexible film, and each of the inner leads has a first width. The outer leads are formed on the flexible film, and each of the outer leads has a second width greater than the first width. Each of the connection portions connects a corresponding one of the inner leads with a corresponding one of the outer leads. At least one of the connection portions has an inner edge and an outer edge. The outer edge has a first rounded concave section, a second rounded concave section, and a first rounded convex section located between the first rounded concave section and the second rounded concave section. The inner edge has a second rounded convex section, a third rounded convex section, and a third rounded concave section located between the second rounded convex section and the third rounded convex section.

According to an exemplary embodiment of the present invention, a curvature radius of the first rounded convex section is greater than a curvature radius of the third rounded concave section.

According to an exemplary embodiment of the present invention, the outer edge further comprises a fourth rounded convex section located between the first rounded convex section and the second rounded concave section.

According to an exemplary embodiment of the present invention, the inner edge further comprises a fourth rounded concave section located between the third rounded concave section and the third rounded convex section.

According to an exemplary embodiment of the present invention, the inner edge and the outer edge are opposite to each other.

According to an exemplary embodiment of the present invention, each of inner edges of others of the connection portions has at least rounded concave section and at least a rounded convex section, and each of outer edges of other connection portions has at least rounded concave section and at least a rounded convex section.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 is a cross-sectional diagram of the flexible circuit board along the line A-A' in FIG. 6.

FIG. 8 is a cross-sectional diagram of the flexible circuit board along the line B-B' in FIG. 6.

DESCRIPTION OF EMBODIMENTS

Figure 1:
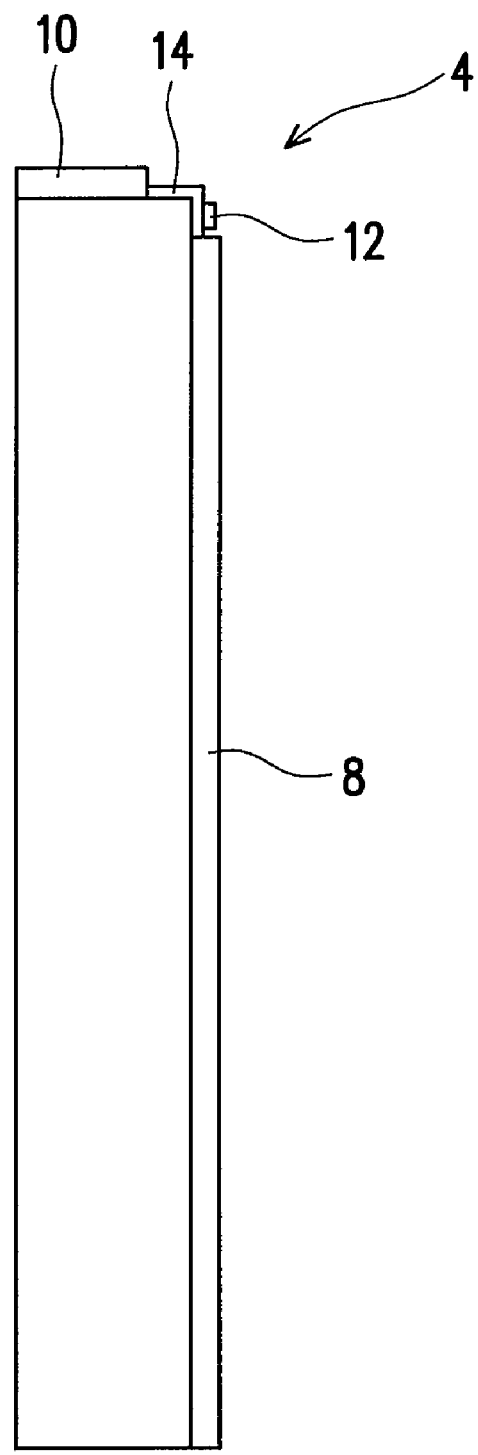
FIG. 1 is a cross-sectional diagram of an electronic apparatus of the prior art.
Figure 2:
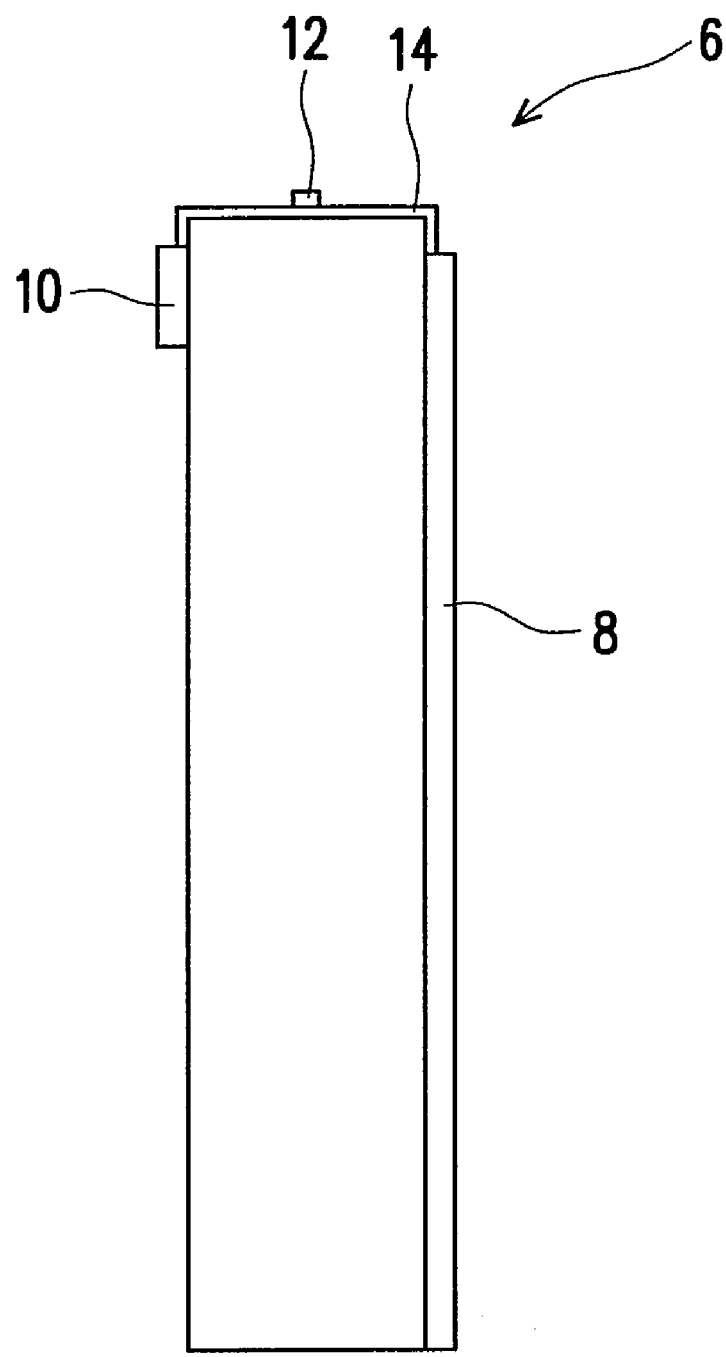
FIG. 2 is a cross-sectional diagram of another electronic apparatus of the prior art.
Figure 3:
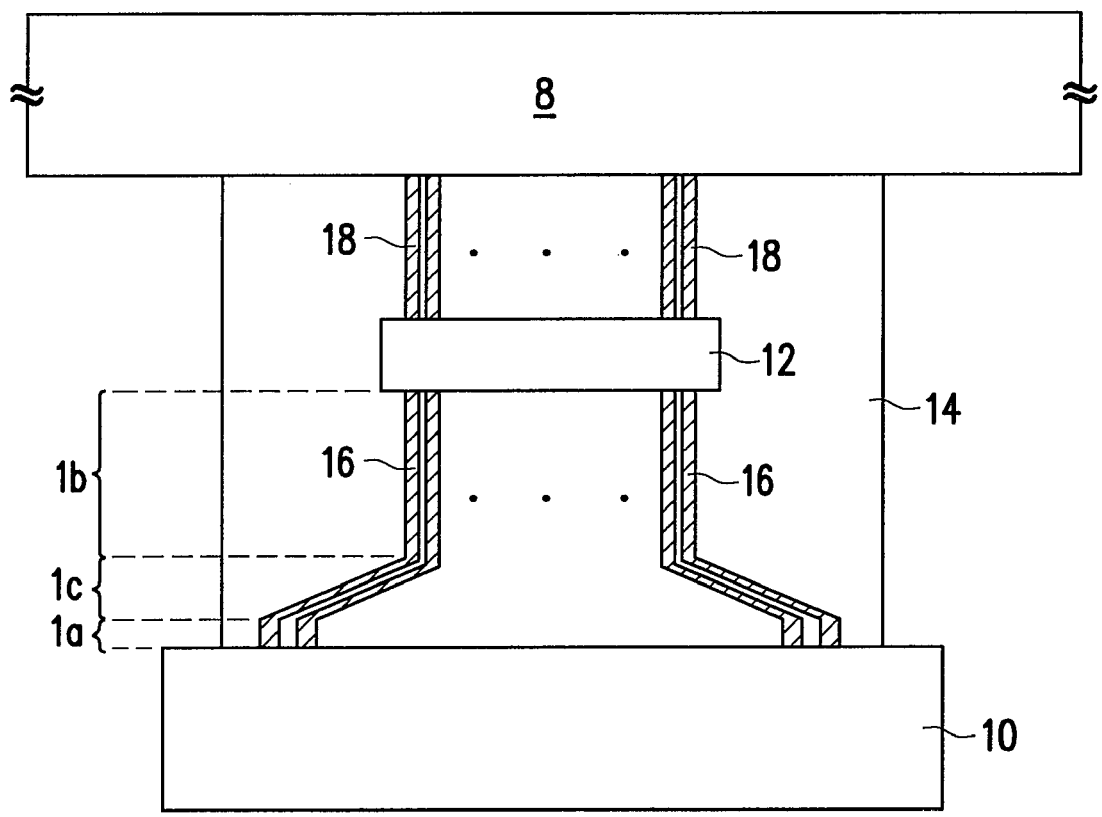
FIG. 3 is a schematic diagram of a display panel, a PCB, a driver IC, and a flexible circuit board of the electronic apparatus in FIG. 1 or FIG. 2.
Figure 4:
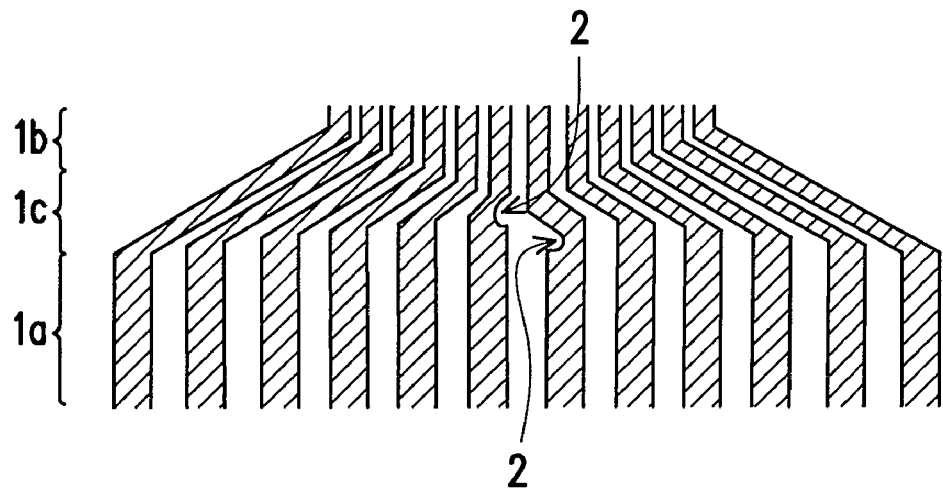
FIG. 4 is a schematic diagram of a flexible circuit board disclosed in a Japan published patent application.
Figure 5:
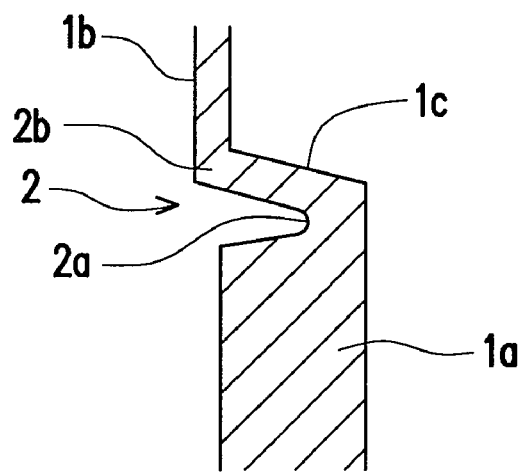
FIG. 5 is an enlarged diagram of a wire of the flexible circuit board shown in FIG. 4.
Figure 6:
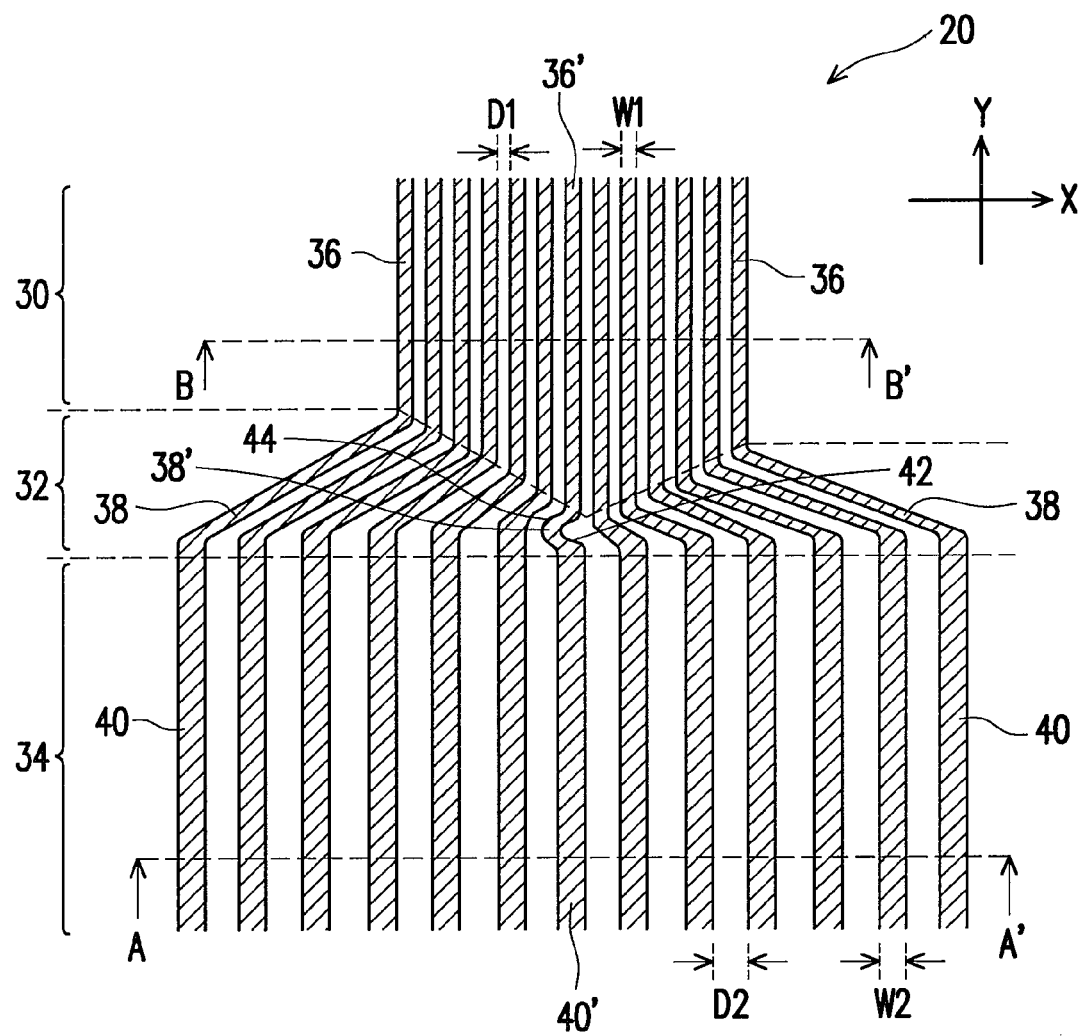
FIG. 6 is a schematic diagram of a flexible circuit board of a first embodiment of the present invention.

Referring to FIG. 6, which is a schematic diagram of a flexible circuit board 20 of a first embodiment of the present invention. The flexible circuit board 20 has a plurality of inner leads 36, a plurality of connection portions 38, and a plurality of outer leads 40. Each of the connection portions 38 connects a corresponding one of the inner leads 36 with a corresponding one of the outer leads 40. As shown in FIG. 6, a group 32 of the connection portions 38 is located between a group 30 of the inner leads 36 and a group 34 of the outer leads 40. Each of the inner leads 36 has a first width W1, and each of the outer leads 40 has a second width W2. The second width W2 is greater the first width W1. According to other preferred embodiments of the present invention, a ratio of the second width W2 to the first width W1 is greater than or equal to 3. However, the present invention is not limited thereto. Either the inner leads 36 or the outer leads 40 are parallel and equally spaced. In other words, a first interval D1 along a first axis X exits between every two neighboring ones of the inner leads 36, and a second interval D2 along the second axis X exits between every two neighboring ones of the outer leads 40. Moreover, the inner leads 36 and the outer leads 40 are extended along a second axis Y. It is noteworthy that the present invention is not limited to any particular interval of the inner leads 36 or the outer leads 40. For example, the inner leads 36 or the outer leads 40 may be spaced with various intervals.

Please refer to FIGS. 7 and 8. FIG. 7 is a cross-sectional diagram of the flexible circuit board 20 along the line A-A' in FIG. 6, and FIG. 8 is a cross-sectional diagram of the flexible circuit board 20 along the line B-B' in FIG. 6. The flexible circuit board 20 further has a flexible film 22 and a solder resist (SR) layer 24. In the embodiment, the flexible film 22 is made of polyimide and has a thickness of 38 mm. The inner leads 36 and the outer leads 40 are formed on the flexible film 22 and covered by the solder resist layer 24. Although it is not illustrated in FIGS. 7 and 8, it still can be understood that the connection portions 38 are also formed on the flexible film 22 and covered by the solder resist layer 24. Additionally, in the embodiment, the inner leads 36, the connection portions 38, and the outer leads 40 are made of copper and have a thickness within a range between 5 mm to 20 mm. However, it should be note that the above is an exemplary one of the embodiments of the present invention, and the present invention is not limited thereto.

Referring to FIG. 6 again, a middle connection portion 38' of the connection portions 38 connects a middle inner lead 36' of the inner leads 36 with a middle outer lead 40' of the outer leads 40. In view from the first axis X, the range along the first axis X, where the inner lead 36' is located, is partly or entirely overlapped with the range along the first axis X, where the outer lead 40' is located. However, in view from the second axis Y, the inner lead 36' is separated from the outer lead 40' by connection portion 38'.

Figure 9:
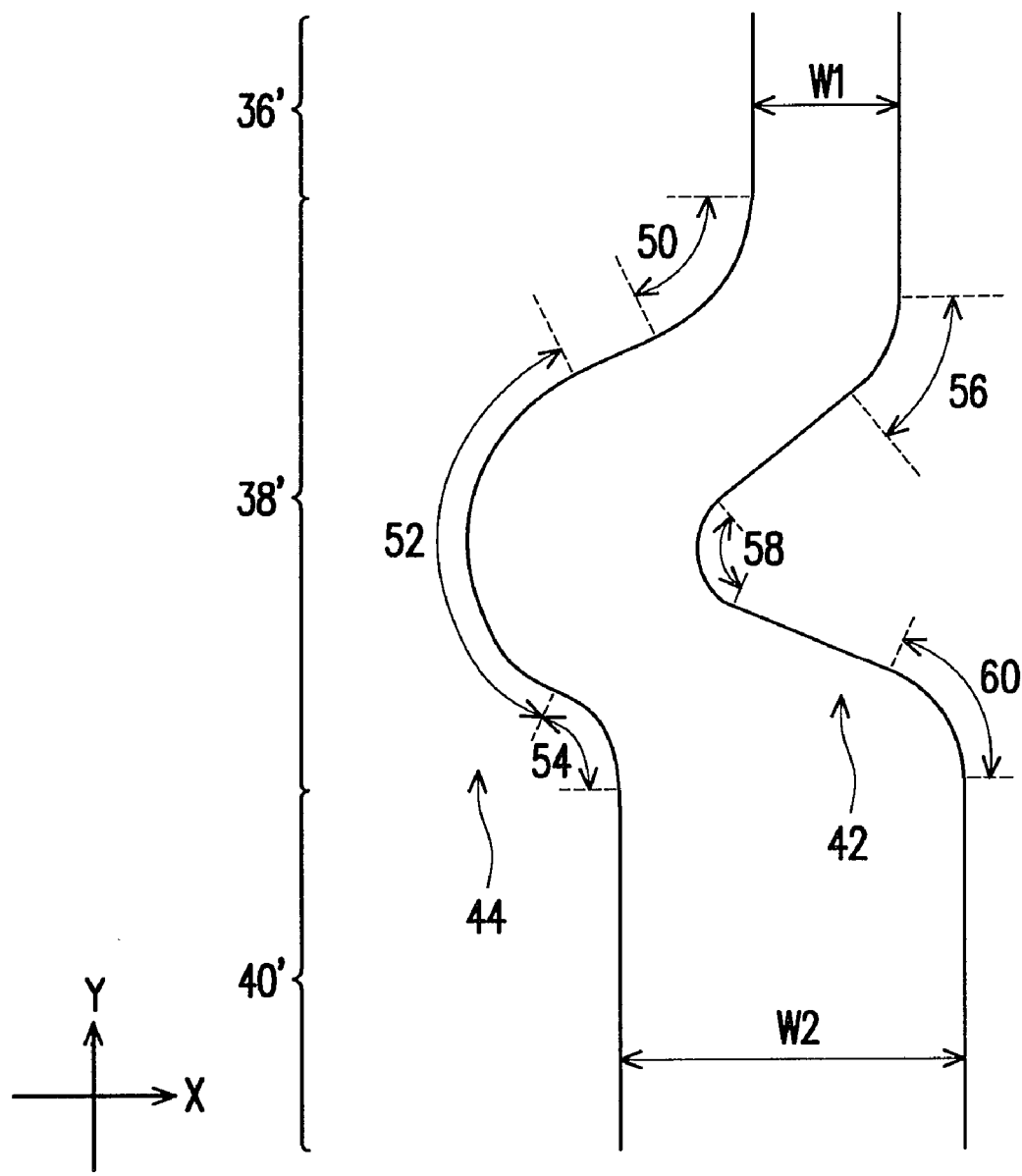
FIG. 9 is an enlarged diagram around the connection portion shown in FIG. 6.

Referring to FIG. 9, which is an enlarged diagram around the connection portion 38'. The connection portion 38' has an inner edge 42 and an outer edge 44. The inner edge 42 and the outer edge 44 are opposite to each other. The inner edge 42 is connected to the right sides of the inner lead 36' and the outer lead 40', and the outer edge 44 is connected to the left sides of the inner lead 36' and the outer lead 40'. The outer edge 44 has a first rounded concave section 50, a first rounded convex section 52, and a second rounded concave section 54. The first rounded convex section 52 is located between the first rounded concave section 50 and the second rounded concave section 54. The inner edge 42 has a second rounded convex section 56, a third rounded concave section 58, and a third rounded convex section 60. The third rounded concave section 58 is located between the second rounded convex section 56 and the third rounded convex section 60.

Figure 10:
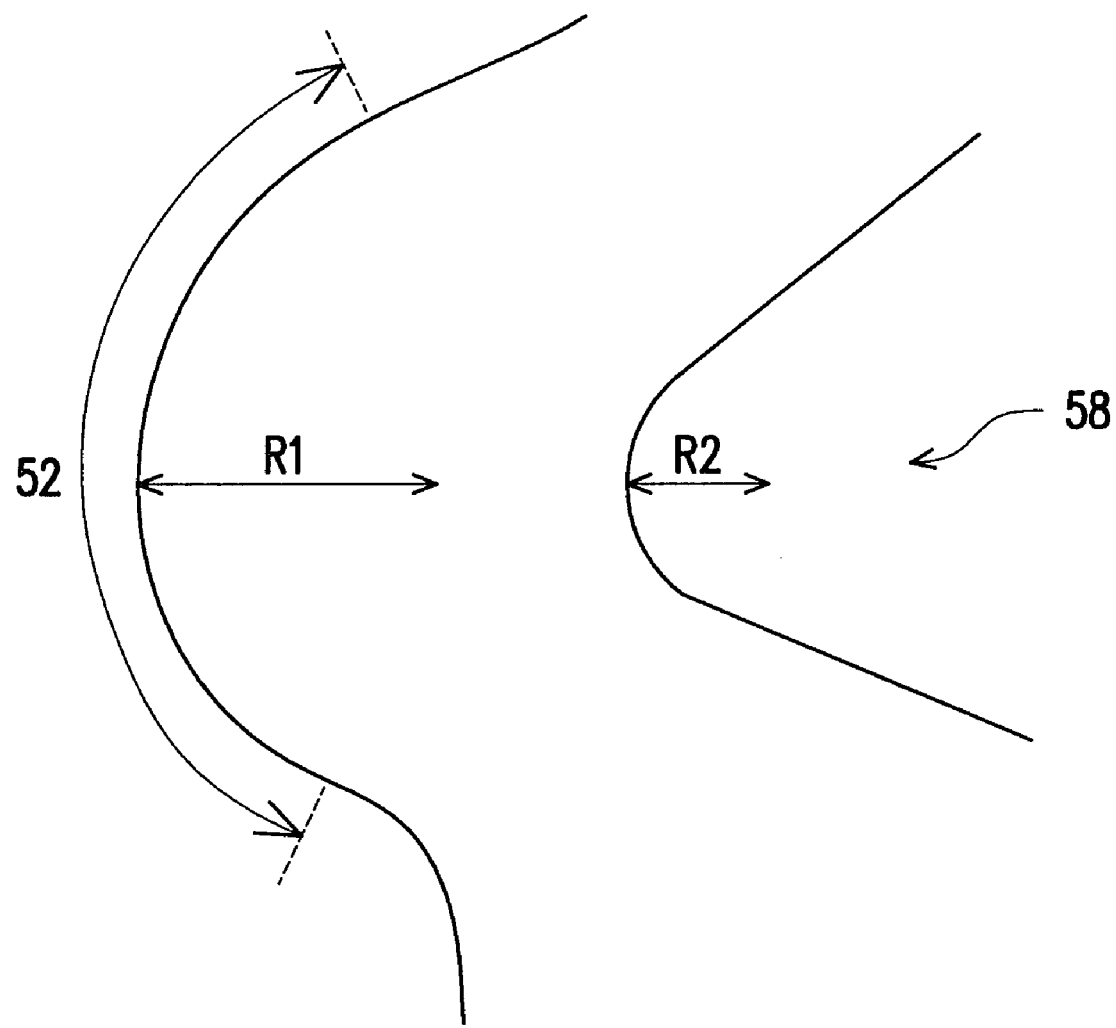
FIG. 10 is a diagram showing a first rounded convex section and a third rounded concave section shown in FIG. 9.

Referring to FIG. 10, which is a diagram showing the first rounded convex section 52 and the third rounded concave section 58. The first rounded convex section 52 has a curvature radius R1, and the third rounded concave section 58 has a curvature radius R2. The curvature radius R1 is greater than a curvature radius R2.

Figure 11:
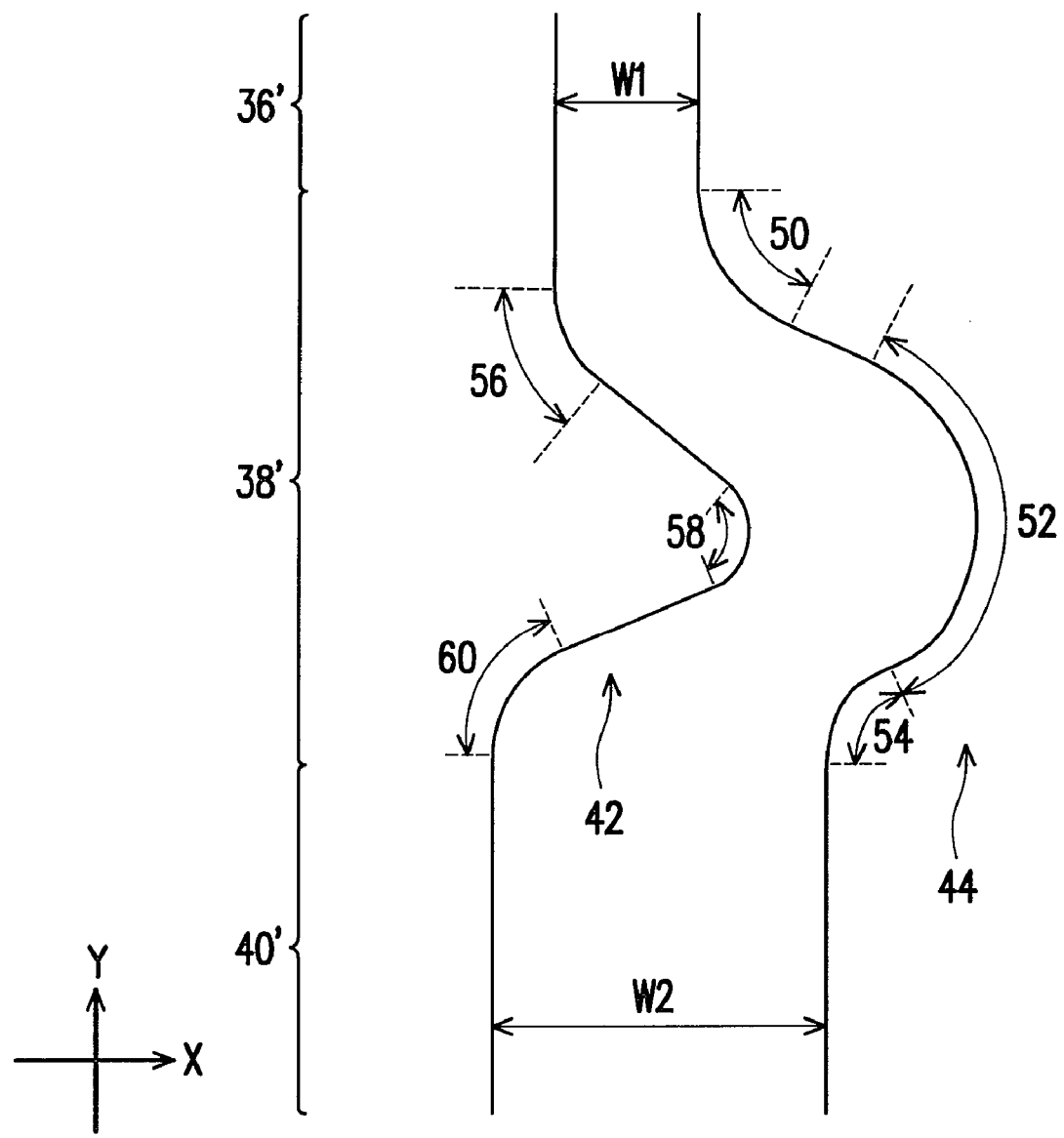
FIG. 11 is a schematic diagram of the inner lead, the connection portion and the outer lead according to a second embodiment of the present invention.

Referring to FIG. 11, which is a schematic diagram of the inner lead 36', the connection portion 38' and the outer lead 40' according to a second embodiment of the present invention. In the embodiment, the inner edge 42 is connected to the left sides of the inner lead 36' and the outer lead 40', and the outer edge 44 is connected to the right sides of the inner lead 36' and the outer lead 40'.

Figure 12:
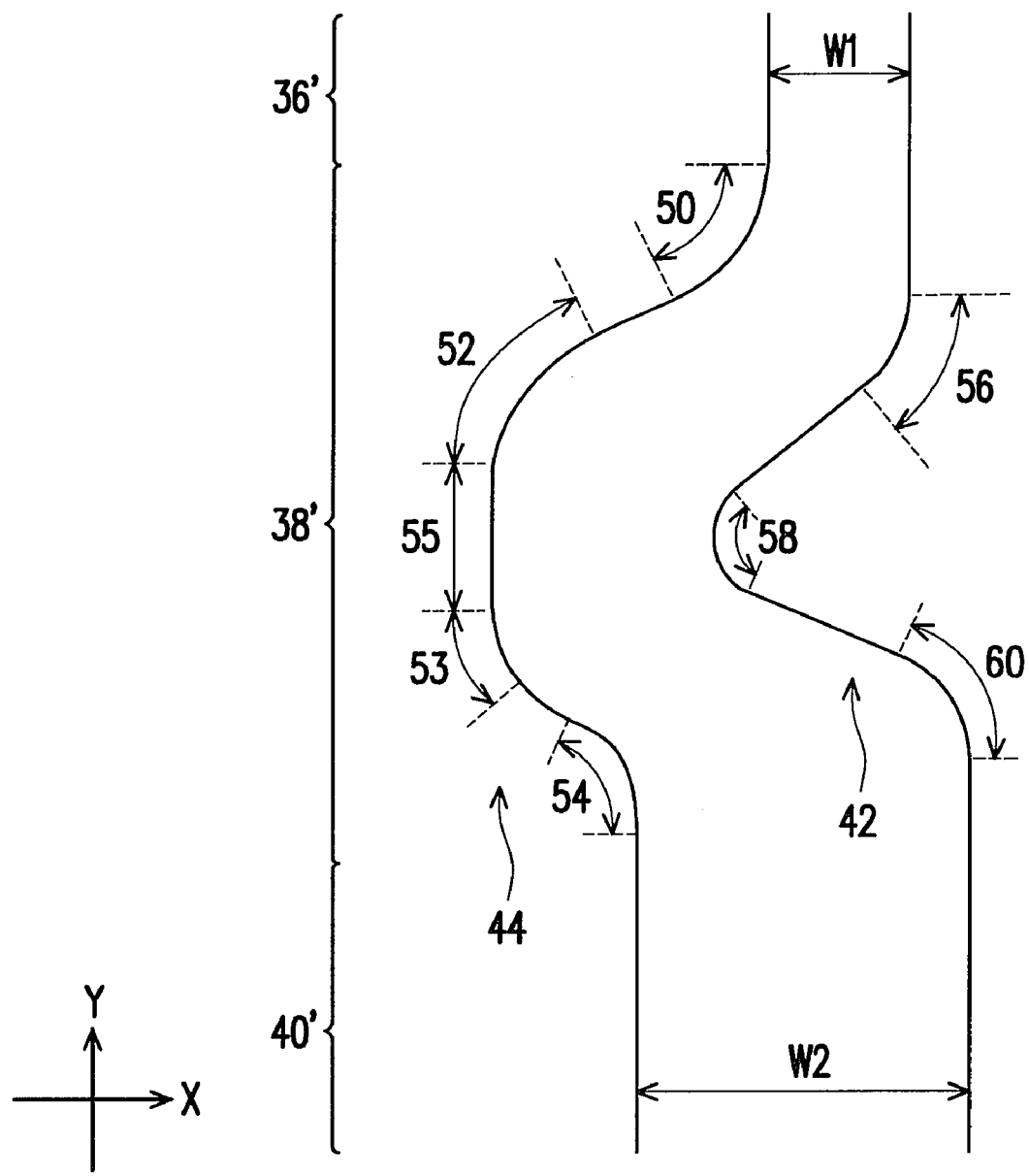
FIG. 12 is a schematic diagram of the inner lead, the connection portion and the outer lead according to a third embodiment of the present invention.

Referring to FIG. 12, which is a schematic diagram of the inner lead 36', the connection portion 38' and the outer lead 40' according to a third embodiment of the present invention. In the embodiment, the inner edge 42 is connected to the right sides of the inner lead 36' and the outer lead 40', and the outer edge 44 is connected to the left sides of the inner lead 36' and the outer lead 40'. Moreover, the outer edge 44 further has a fourth rounded convex section 53, which is located between the first rounded convex section 52 and the second rounded concave section 54. In the embodiment, a middle section 55 that connects to the first rounded convex section 52 and the fourth rounded convex section 53 is straight. However, it should be noted that the present invention is not limited thereto. For example, the middle section 55 could be another rounded convex section.

Figure 13:
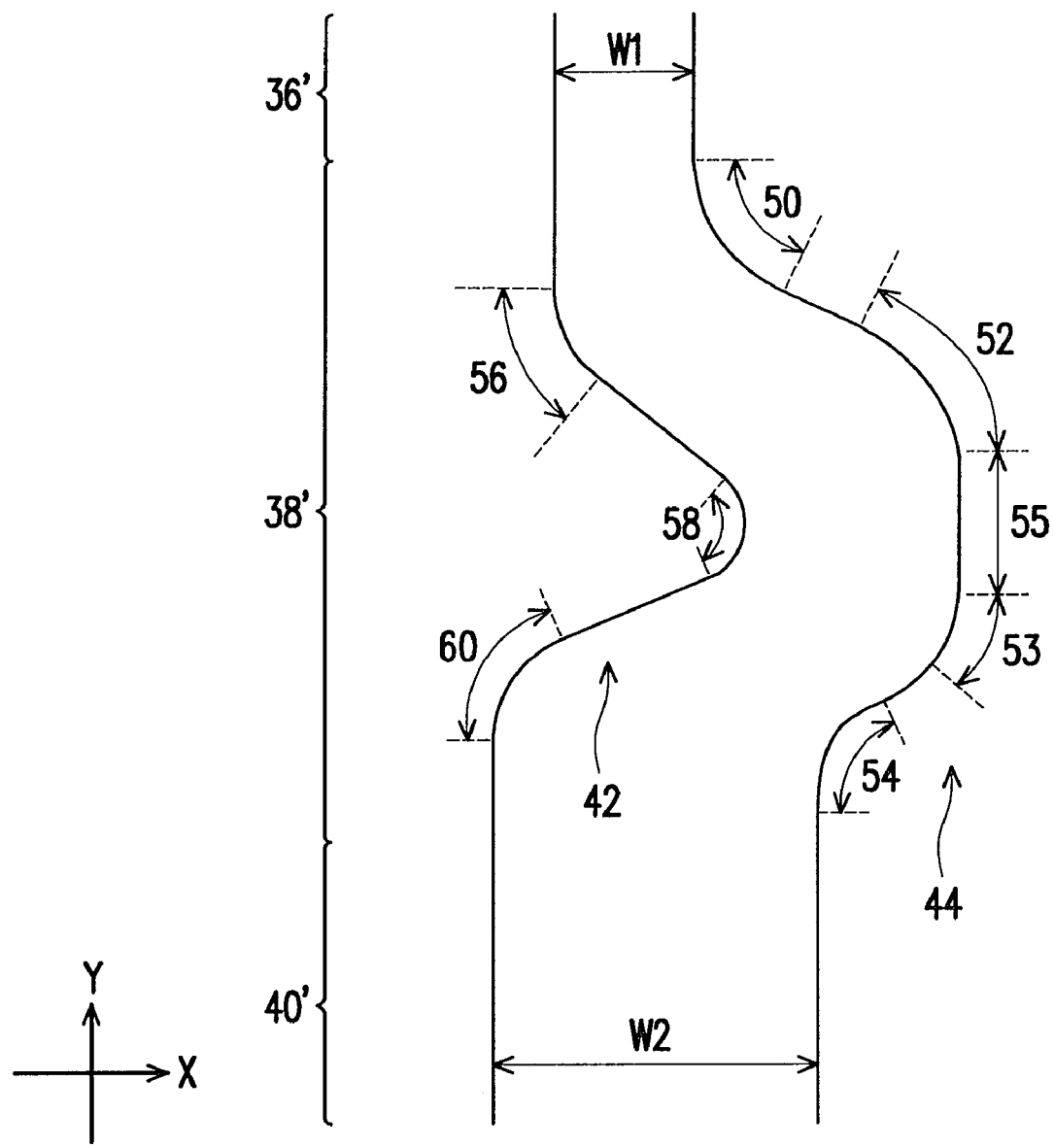
FIG. 13 is a schematic diagram of the inner lead, the connection portion and the outer lead according to a fourth embodiment of the present invention.

Referring to FIG. 13, which is a schematic diagram of the inner lead 36', the connection portion 38' and the outer lead 40' according to a fourth embodiment of the present invention. In the embodiment, the inner edge 42 is connected to the left sides of the inner lead 36' and the outer lead 40', and the outer edge 44 is connected to the right sides of the inner lead 36' and the outer lead 40'. Moreover, the outer edge 44 also has a fourth rounded convex section 53 and a middle section 55. The fourth rounded convex section 53 is located between the first rounded convex section 52 and the second rounded concave section 54.

Figure 14:
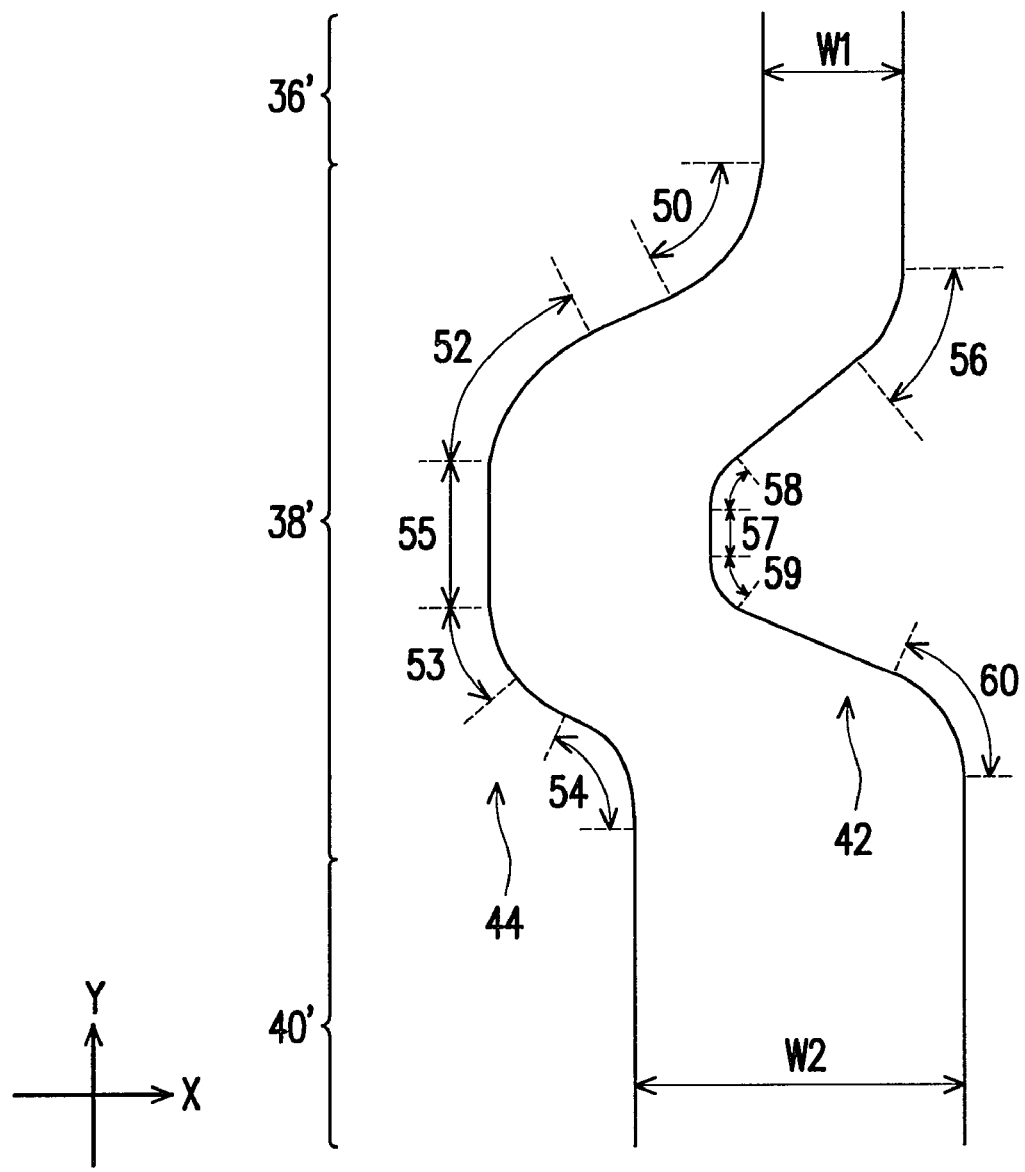
FIG. 14 is a schematic diagram of the inner lead, the connection portion and the outer lead according to a fifth embodiment of the present invention.

Referring to FIG. 14, which is a schematic diagram of the inner lead 36', the connection portion 38' and the outer lead 40' according to a fifth embodiment of the present invention. In the embodiment, the inner edge 42 is connected to the right sides of the inner lead 36' and the outer lead 40', and the outer edge 44 is connected to the left sides of the inner lead 36' and the outer lead 40'. Moreover, the inner edge 42 further has a fourth rounded concave section 59, which is located between the third rounded concave section 58 and the third rounded convex section 60. In the embodiment, a middle section 57 that connects to the third rounded concave section 58 and the fourth rounded concave section 59 is straight. However, it should be noted that the present invention is not limited thereto. For example, the middle section 57 could be another rounded concave section.

Figure 15:
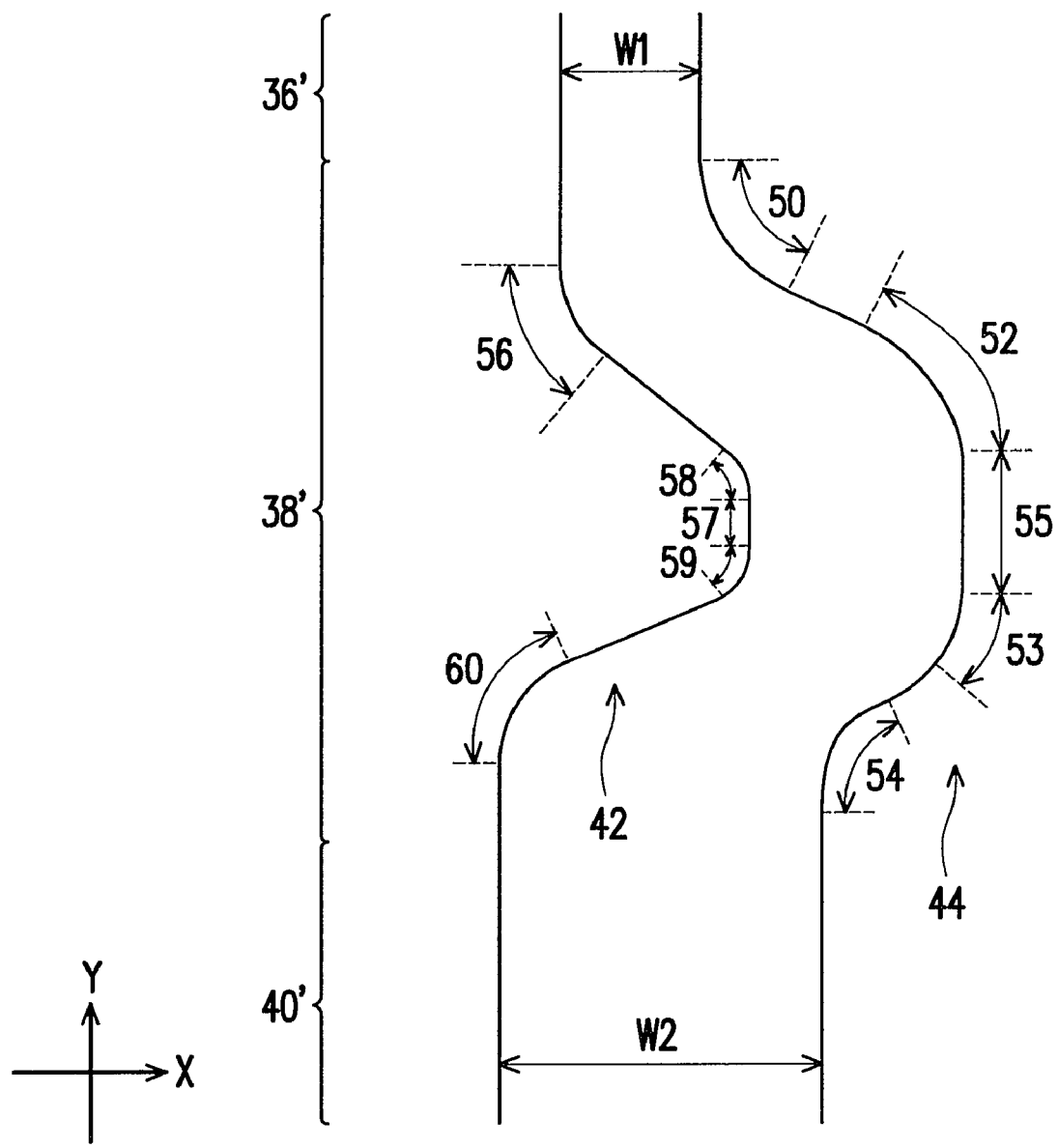
FIG. 15 is a schematic diagram of the inner lead, the connection portion and the outer lead according to a sixth embodiment of the present invention.

Referring to FIG. 15, which is a schematic diagram of the inner lead 36', the connection portion 38' and the outer lead 40' according to a sixth embodiment of the present invention. In the embodiment, the inner edge 42 is connected to the left sides of the inner lead 36' and the outer lead 40', and the outer edge 44 is connected to the right sides of the inner lead 36' and the outer lead 40'. Moreover, the outer edge 44 also has a fourth rounded convex section 53 and a middle section 55, and the inner edge also has a fourth rounded concave section 59 and a middle section 57. The fourth rounded convex section 53 is located between the first rounded convex section 52 and the second rounded concave section 54, and the fourth rounded concave section 59 is located the third rounded concave section 58 and the third rounded convex section 60.

Figure 16:
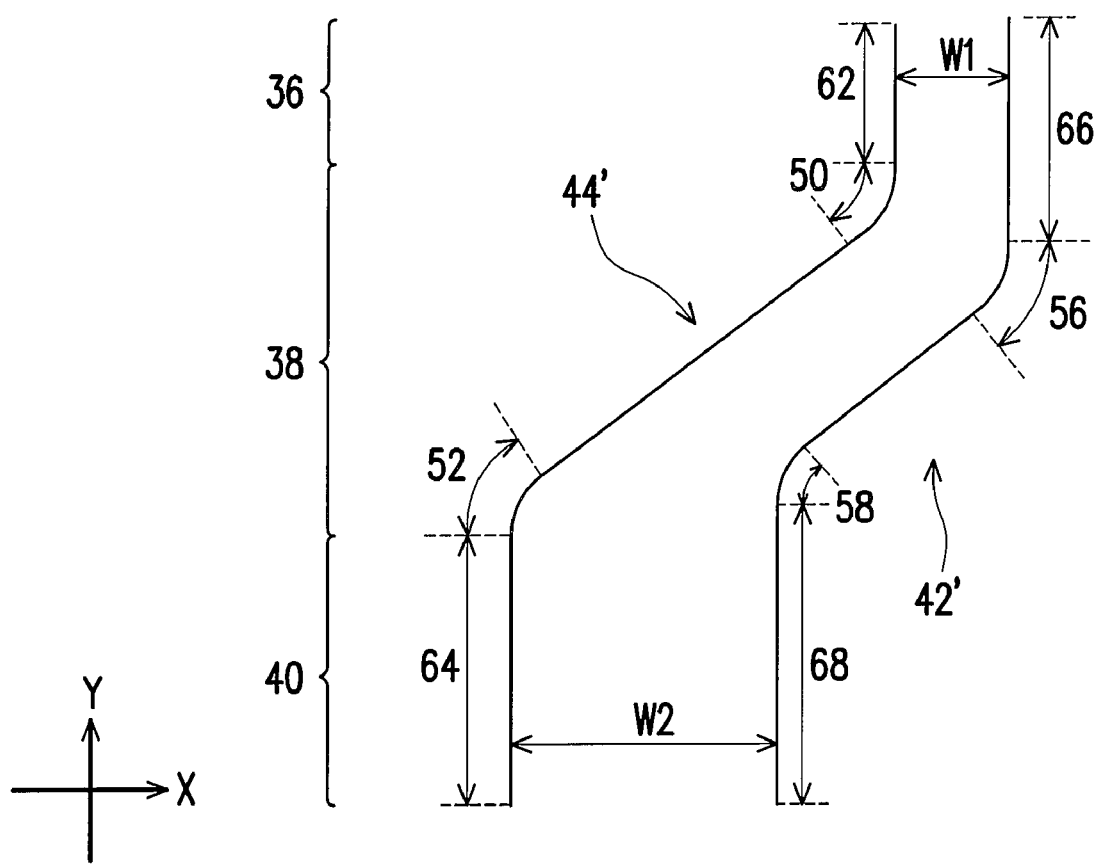
FIGS. 16 and 17 are schematic diagrams of the rest of the rest inner leads, the connection portions and the outer leads shown in FIG. 6.
Figure 17:
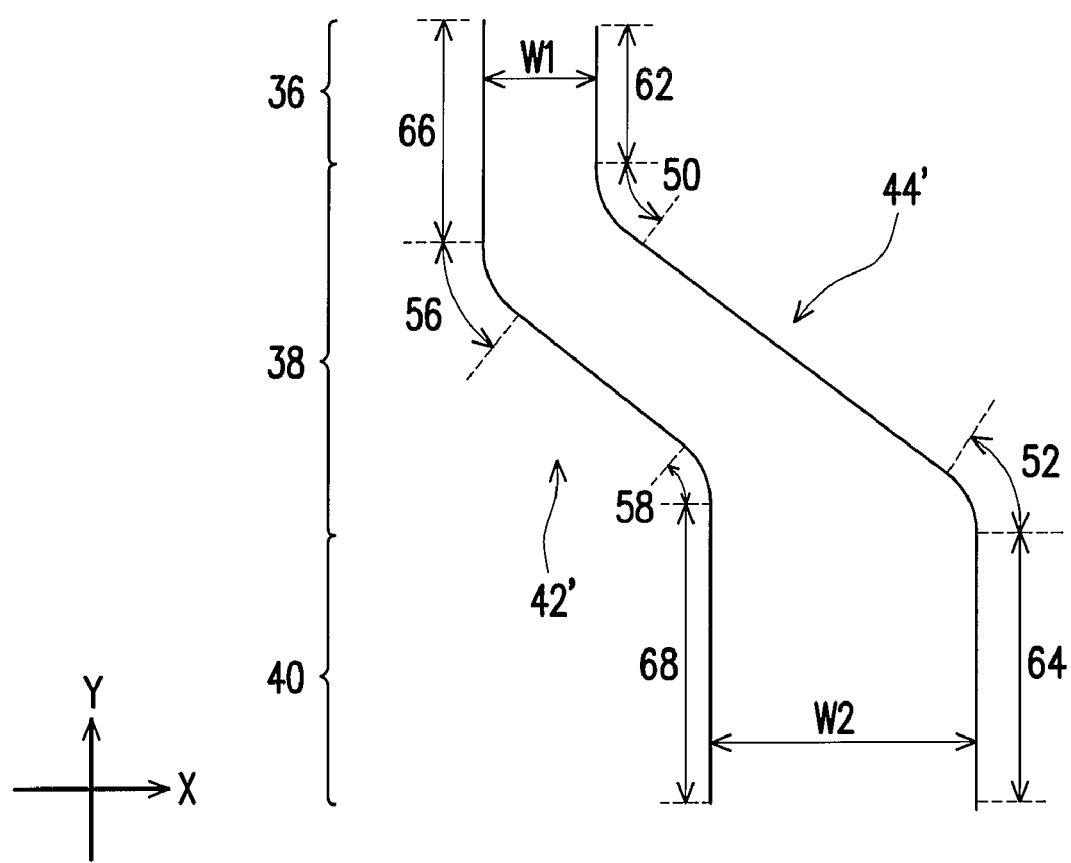

Referring to FIGS. 16 and 17, which are schematic diagrams of the rest of the rest inner leads 36, the connection portions 38 and the outer leads 40. Except the inner edge 42 of the connection portion 38', each of inner edges 42' of other connection portions 38 has at least rounded concave section 58 and at least a rounded convex section 56. Moreover, except the outer edge 44 of the connection portion 38', each of outer edges 44' of other connection portions 38 has at least rounded concave section 50 and at least a rounded convex section 52. As shown in FIGS. 16 and 17, the rounded concave section 50 is connected to a first side 62 of a corresponding inner lead 36, and the rounded convex section 52 is connected to a first side 64 of a corresponding outer lead 40. Additionally, the rounded convex section 56 is connected to the a second side 66 of the corresponding inner lead 36, and the rounded concave section 58 is connected to a second side 68 of the corresponding outer lead 40.

It should be noted that each of the rounded concave sections in the document could be technically termed as a fillet, and that each of the rounded convex sections in the document could be technically termed as a round.

In summary, due to the use of the rounded concave sections and the rounded convex sections of the connection portions in the flexible circuit board of the present invention, if the flexible circuit board is bent, the mechanical stress around the corners of the joint portions of the connection portions with the inner leads and the outer leads could be alleviated. Therefore, not only the possibility that the joint portions of the inner leads and the connection portions break under force could be decreased, but also the possibility that the joint portions of the outer leads and the connection portions break under force could be decreased as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible circuit board, comprising:
   a flexible film;
   a plurality of inner leads formed on the flexible film, each of the inner leads having a first width;
   a plurality of outer leads formed on the flexible film, each of the outer leads having a second width greater than the first width; and
   a plurality of connection portions, each of the connection portions connecting a corresponding one of the inner leads with a corresponding one of the outer leads, and at least one connection portion of the connection portions has an inner edge and an outer edge, wherein the outer edge has a first rounded concave section, a second rounded concave section, and a first rounded convex section located between the first rounded concave section and the second rounded concave section, and the inner edge has a second rounded convex section, a third rounded convex section, and a third round concave section located between the second rounded convex section and the third rounded convex section.

2. The flexible circuit board as claimed in claim 1, wherein a curvature radius of the first rounded convex section is greater than a curvature radius of the third rounded concave section.

3. The flexible circuit board as claimed in claim 1, wherein the outer edge further comprises a fourth rounded convex section located between the first rounded convex section and the second rounded concave section.

4. The flexible circuit board as claimed in claim 3, wherein the outer edge further comprises a middle section located between the first rounded convex section and the fourth rounded convex section.

5. The flexible circuit board as claimed in claim 1, wherein the inner edge further comprises a fourth rounded concave section located between the third rounded concave section and the third rounded convex section.

6. The flexible circuit board as claimed in claim 5, wherein the inner edge further comprises a middle section located between the third rounded concave section and the fourth rounded concave section.

7. The flexible circuit board as claimed in claim 1, wherein the inner edge and the outer edge are opposite to each other.

8. The flexible circuit board as claimed in claim 1, wherein each of inner edges of other connection portions has at least rounded concave section and at least a rounded convex section, and each of outer edges of other connection portions has at least rounded concave section and at least a rounded convex section.

* * * * *